(12) United States Patent
Horng

(10) Patent No.: US 12,040,239 B2
(45) Date of Patent: Jul. 16, 2024

(54) METHOD FOR SUPPRESSING MATERIAL WARPAGE BY INCREASING GAS DENSITY

(71) Applicant: ABLEPRINT TECHNOLOGY CO., LTD., Miaoli County (TW)

(72) Inventor: Chih-Horng Horng, Hsinchu (TW)

(73) Assignee: ABLEPRINT TECHNOLOGY CO., LTD., Miaoli County (TW)

(*) Notice: Subject to any disclaimer, the term of this patent is extended or adjusted under 35 U.S.C. 154(b) by 463 days.

(21) Appl. No.: 17/546,066

(22) Filed: Dec. 9, 2021

(65) Prior Publication Data

US 2022/0246482 A1 Aug. 4, 2022

(30) Foreign Application Priority Data

Feb. 1, 2021 (TW) ................ 110103942

(51) Int. Cl.
 *H01L 23/525* (2006.01)
 *C23C 16/02* (2006.01)
 *C23C 16/46* (2006.01)
 *H01L 21/66* (2006.01)

(52) U.S. Cl.
 CPC .......... *H01L 22/22* (2013.01); *C23C 16/0209* (2013.01); *C23C 16/463* (2013.01)

(58) Field of Classification Search
 CPC .... H01L 22/22; C23C 16/0209; C23C 16/463
 USPC ............................................................ 438/5
 See application file for complete search history.

(56) References Cited

U.S. PATENT DOCUMENTS

2002/0052124 A1* 5/2002 Raaijmakers ......... H01L 21/022
 438/791

* cited by examiner

*Primary Examiner* — Monica D Harrison

(57) ABSTRACT

Disclosed is a method for suppressing material warpage by increasing a gas density. The method comprises the following steps: a. placing a plurality of semiconductor elements in a processing chamber; b. increasing a temperature in the processing chamber to a first predetermined temperature and importing a gas, to increase pressure to predetermined pressure and apply the processing chamber in a high-temperature and high-pressure working environment; and performing an isothermal-isobaric process at the first predetermined temperature and the predetermined pressure, to improve temperature uniformity by the high pressure gas; and c. decreasing the temperature in the processing chamber from the first predetermined temperature to a second predetermined temperature and continuing to import the gas into the processing chamber, to maintain the processing chamber at the predetermined pressure; and performing a cooling and isobaric process on each semiconductor element, to suppress warpage of each semiconductor element.

6 Claims, 2 Drawing Sheets

METHOD FOR SUPPRESSING MATERIAL WARPAGE BY INCREASING GAS DENSITY

CROSS REFERENCE TO RELATED APPLICATIONS

The present application claims the benefit of Taiwanese Patent Application No. 110103942 filed on Feb. 1, 2021, the contents of which are incorporated herein by reference in their entirety.

BACKGROUND OF THE INVENTION

1. Field of the Invention

The present invention relates to the technical field of electronic packaging, and in particular, provides a method for suppressing material warpage by increasing a gas density, where on the one hand, a quantity of gas molecules in a processing chamber is increased to improve gas temperature uniformity, and on the other hand, the processing chamber is maintained at predetermined pressure, to prevent a semiconductor element from generating stress and vibrating at a high temperature due to an internal and external pressure difference, thereby effectively suppressing warpage of the semiconductor element.

2. Description of the Related Art

In recent years, electronic technologies are changing rapidly. Electronic products composed of wafers as base materials have become indispensable tools in modern people's daily lives. With the trend of designing electronic products to be light, thin, short, and small, increasingly stringent requirements are posed on precision of semiconductor elements such as wafers. When high-temperature and high-pressure related processes are performed on the wafer in a processing chamber, temperature uniformity is often poor in the processing chamber, resulting in different thermal expansion or thermal contraction of various parts of the wafer with a temperature change. Moreover, with a pressure change, a high-pressure gas in the processing chamber causes various layers of materials on the wafer to generate stress and vibrate due to a pressure difference. Consequently, the wafer generates thermal stress due to a temperature difference between the parts, and with a gas pressure change, the various layers of materials on the wafer generate stress and vibrate due to the pressure difference, leading to warpage. Further, worse temperature uniformity in the processing chamber and a greater gas pressure change induce severer warpage of the wafer, which badly affects production quality of the wafer and increase production costs. In this case, an improvement is required.

Therefore, for a problem of warpage of the conventional wafer and other semiconductor elements caused by thermal stress, a pressure difference, and vibration, how to develop a method for suppressing material warpage that is more practical and economical is actively researched and innovated by relevant industries.

In view of this, the inventor has engaged in manufacturing, development, and design of related products for many years, and eventually obtains a practical invention after detailed design and careful evaluation for the foregoing objective.

SUMMARY OF THE INVENTION

Technical Problem to be Solved

When high-temperature and high-pressure related processes are performed on a conventional wafer in a processing chamber, temperature uniformity is often poor in the processing chamber. Consequently, the wafer generates thermal stress due to a temperature difference between various parts. Moreover, with a gas pressure change, various layers of materials on the wafer generate stress and vibrate due to a pressure difference, leading to warpage. This badly affects product reliability and quality. In this case, an improvement is required.

Technical Feature for Problem Solving

To overcome the foregoing problem, the present invention provides a method for suppressing material warpage by increasing a gas density, including the following steps: a. placing a plurality of semiconductor elements in a processing chamber;

b. increasing a temperature in the processing chamber from an initial temperature to a first predetermined temperature and importing at least one gas into the processing chamber, to increase pressure in the processing chamber from initial pressure to predetermined pressure and apply the processing chamber in a high-temperature and high-pressure working environment; and performing isothermal-isobaric process on each semiconductor element at the first predetermined temperature and the predetermined pressure for a predetermined time, to effectively improve gas temperature uniformity in the processing chamber by the high pressure gas, where the initial temperature in the processing chamber is a room temperature, and the initial pressure is atmospheric pressure (1 atm); and c. decreasing the temperature in the processing chamber from the first predetermined temperature to a second predetermined temperature at a predetermined rate and continuing to import the at least one gas into the processing chamber, to maintain the processing chamber at the predetermined pressure; and performing a cooling and isobaric process on each semiconductor element for a predetermined time, to increase a quantity of gas molecules in the processing chamber, so that the processing chamber is maintained at the predetermined pressure. The gas molecules increased in the processing chamber help improve gas temperature uniformity, and the processing chamber is maintained at the predetermined pressure (an isobaric state is maintained), to reduce stress and vibration of various layers of materials on each semiconductor element caused by a pressure difference. On the whole, warpage of the semiconductor element can be effectively suppressed. Finally, the temperature changes back to the initial temperature from the second predetermined temperature, and the pressure changes back to the initial pressure from the predetermined pressure. In this way, a set process is completed.

As described above, the at least one gas is air and/or nitrogen.

As described above, the at least one gas in step (b) has a predetermined quantity of gas molecules, and the predetermined quantity of gas molecules cause the processing chamber to be maintained at the predetermined pressure, to more accurately control gas temperature uniformity in the processing chamber by the predetermined quantity of gas molecules.

As described above, the first predetermined temperature is set to fall within a range of 60° C. to 1500° C.

As described above, the second predetermined temperature is set to fall within a range of (25° C., 100° C.], and the second predetermined temperature is less than the first predetermined temperature.

As described above, the predetermined pressure is set to fall within a range of (1.3 atmospheric pressure (atm), 100 atmospheric pressure (atm)).

Effect compared with that of the prior art: According to the method for suppressing material warpage by increasing a gas density in the present invention, the quantity of gas molecules in the processing chamber is increased, to effectively improve gas temperature uniformity in the processing chamber, and gas temperature uniformity in the processing chamber can be more accurately controlled by the predetermined quantity of gas molecules. On the one hand, the quantity of gas molecules in the processing chamber is increased, to improve gas temperature uniformity, and on the other hand, the processing chamber is maintained at the predetermined pressure (the isobaric state is maintained), to prevent the various layers of materials on each semiconductor element from generating stress and vibrating due to the pressure difference, thereby effectively suppress warpage of each semiconductor element.

A technology, a means, and an effect of the present invention are described in detail below by using a preferred embodiment with reference to the accompanying drawings, to deeply and concretely understand the foregoing objective, structure, and feature of the present invention.

DETAILED DESCRIPTION OF THE PREFERRED EMBODIMENTS

Figure 1:
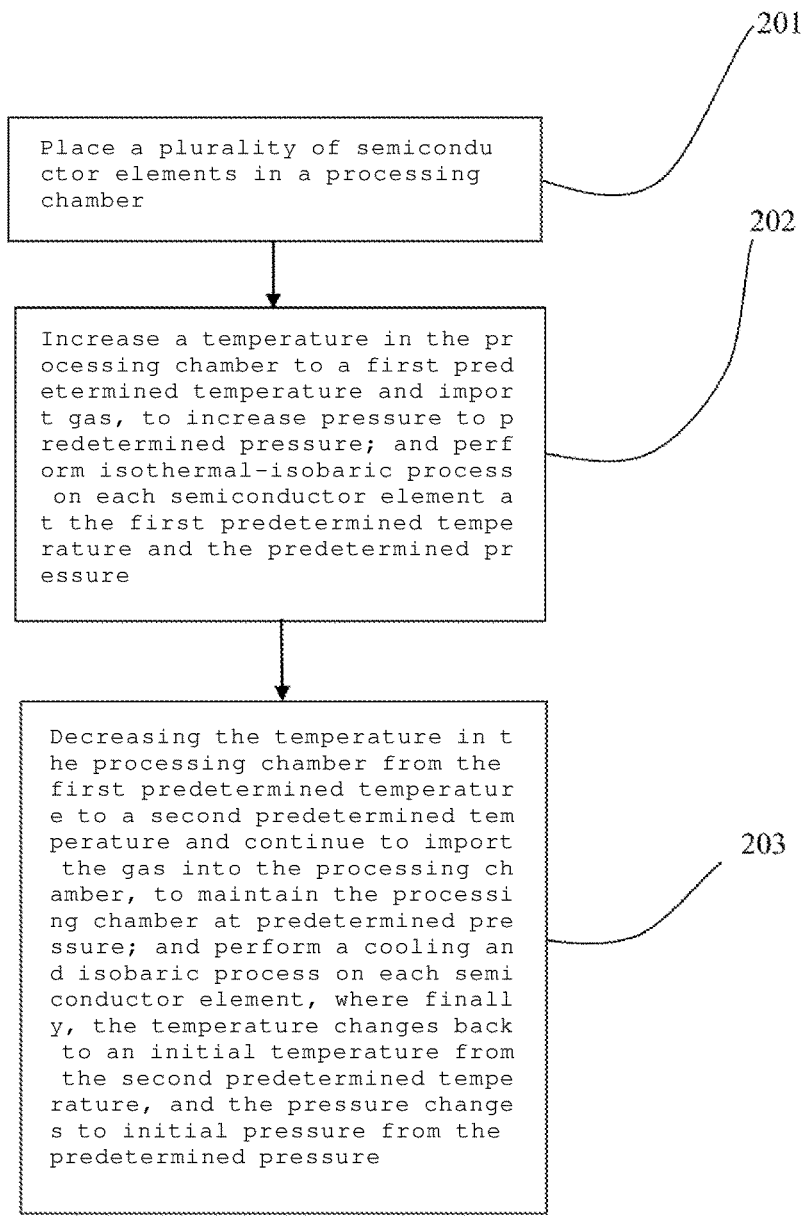
FIG. 1 is a flowchart of a method for suppressing material warpage by increasing a gas density according to an embodiment of the present invention.
Figure 2:
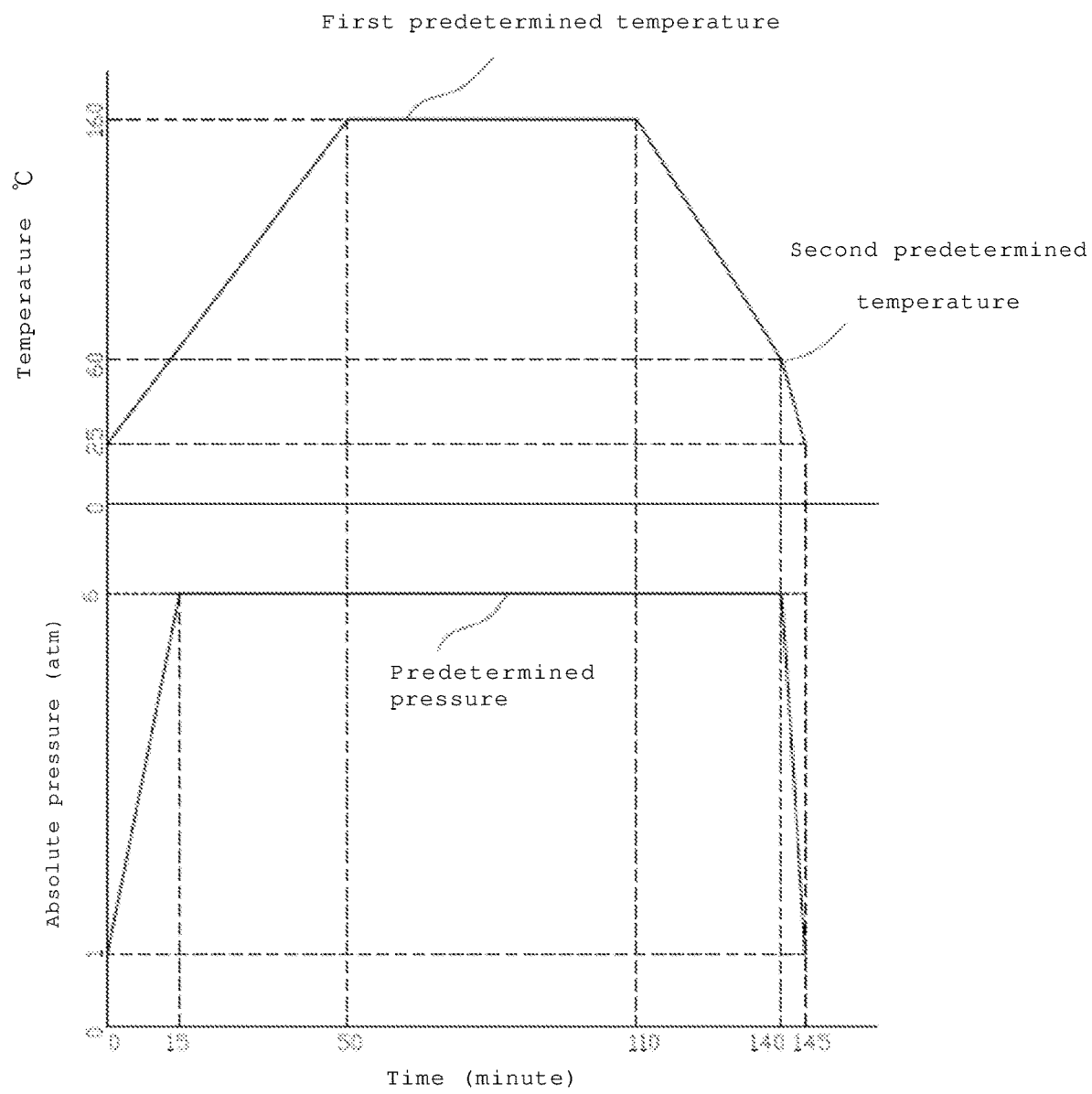
FIG. 2 is a diagram of a relationship among a process temperature, pressure, and a time according to an embodiment of the present invention.

As shown in FIG. 1 and FIG. 2, the present invention provides a method for suppressing material warpage by increasing a gas density, including the following steps: a. (step 201) Place a plurality of semiconductor elements in a processing chamber.

b. (step 202) Increase a temperature in the processing chamber from an initial temperature to a first predetermined temperature and import at least one gas into the processing chamber, to increase pressure in the processing chamber from initial pressure to predetermined pressure and apply the processing chamber in a high-temperature and high-pressure working environment; and perform isothermal-isobaric process on each semiconductor element at the first predetermined temperature and the predetermined pressure for a predetermined time. The high pressure gas has a relatively large gas density, which means that there are many gas molecules. Each gas molecule is a carrier for heat transfer, and each type of gas has a specific heat conduction capability. If a quantity of gas molecules can be increased in definite space (the processing chamber), gas temperature uniformity in the processing chamber can be improved (in other words, gas temperature uniformity in the processing chamber is effectively improved by high pressure gas). The initial temperature in the processing chamber is a room temperature, the first predetermined temperature is set to fall within a range of 60° C. to 1500° C., the initial pressure is atmospheric pressure (1 atm), and the predetermined pressure is set to fall within a range of (1.3 atmospheric pressure (atm), 100 atmospheric pressure (atm)).

c. (step 203) Decrease the temperature in the processing chamber from the first predetermined temperature to a second predetermined temperature at at least one predetermined rate and continue to import the at least one gas into the processing chamber, to maintain the processing chamber at predetermined pressure; and perform a cooling and isobaric process on each semiconductor element for a predetermined time. It can be learned from the conventional ideal gas equation of state: $P=\rho RT$ (where P represents gas pressure, $\rho$ represents a gas density, R represents a gas constant, and T represents a gas temperature) or $PV=NMRT$ (where P represents gas pressure, V represents a gas volume, N represents a quantity of gas molecules, M represents a gas molecule weight, R represents a gas constant, and T represents a gas temperature) that, because R, V, and M are all fixed values, when the temperature is decreased, the gas needs to be imported into the processing chamber to maintain the processing chamber at the predetermined pressure (in other words, a quantity of gas molecules in the processing chamber is increased, to maintain the processing chamber at the predetermined pressure). The gas molecules increased in the processing chamber help improve gas temperature uniformity, and the processing chamber is maintained at the predetermined pressure (an isobaric state is maintained), to reduce stress and vibration of various layers of materials on each semiconductor element caused by a pressure difference. On the whole, warpage of the semiconductor element can be effectively suppressed. Finally, the temperature changes back to the initial temperature from the second predetermined temperature, and the pressure changes back to the initial pressure from the predetermined pressure. In this way, a set process is completed. The second predetermined temperature is set to fall within a range of (25° C., 100° C.], and the second predetermined temperature is less than the first predetermined temperature.

As described above, the at least one gas is air and/or nitrogen.

As described above, the at least one gas in step (202) has a predetermined quantity of gas molecules, and the predetermined quantity of gas molecules cause the processing chamber to be maintained at the predetermined pressure, to more accurately control gas temperature uniformity in the processing chamber by the predetermined quantity of gas molecules.

As shown in FIG. 2, in an embodiment of the present invention, the set process consumes 145 minutes. The temperature in the processing chamber is increased from the initial temperature (25° C.) to the first predetermined temperature (160° C.), and is maintained at 160° C. for a predetermined time (60 minutes). Then it takes 30 minutes to decrease from the first predetermined temperature (160° C.) to the second predetermined temperature (60° C.) at the predetermined rate (3.3° C./minute). Finally, the second predetermined temperature (60° C.) is decreased to the initial temperature (25° C.), the pressure in the processing chamber is increased from the initial pressure (1 atm) to the predetermined pressure (6 atm), and the predetermined pressure is maintained for a predetermined time (125 minutes); and the predetermined pressure (6 atm) is decreased to the initial pressure (1 atm). However, necessary adjustments can be made to the temperature, the pressure, and the time according to requirements of the process.

As described above, in the embodiments, dimensions of the processing chamber are as follows: A diameter is 600 mm and a length is 530 mm.

As described above, in the embodiments, in the isothermal-isobaric process (60 minutes), when the first predetermined temperature is 160° C. and the predetermined pressure is 6 atm, gas temperature uniformity is within +/−3° C.

As described above, in the embodiments, in the cooling and isobaric process (30 minutes), when the first predetermined temperature is 160° C., the second predetermined temperature is 60° C., and the predetermined pressure is 6 atm, gas temperature uniformity is within +/−5° C.

According to the method for suppressing material warpage by increasing a gas density in the present invention, in step 202, the processing chamber is applied in the high-temperature and high-pressure working environment, and the quantity of gas molecules in the processing chamber is increased, thereby effectively improving gas temperature uniformity in the processing chamber.

According to the method for suppressing material warpage by increasing a gas density in the present invention, in step 202, gas temperature uniformity in the processing chamber can be more accurately controlled by the predetermined quantity of gas molecules.

According to the method for suppressing material warpage by increasing a gas density in the present invention, in step 203, the gas continues to be imported into the processing chamber, to maintain the processing chamber at the predetermined pressure. On the one hand, the quantity of gas molecules in the processing chamber is increased, to improve gas temperature uniformity, and on the other hand, the processing chamber is maintained at the predetermined pressure (the isobaric state is maintained), to prevent the various layers of materials on each semiconductor element from generating stress and vibrating due to the pressure difference. The foregoing superposition effect can effectively suppress warpage of the semiconductor element.

The foregoing is a specific description of the technical features of the present invention for the preferred embodiment of the present invention. However, a person skilled in the art may make changes and modifications to the present invention without deviating from the spirit and principles of the present invention, and such changes and modifications shall fall within the scope defined by the following patent application.

What is claimed is:

1. A method for suppressing material warpage by increasing a gas density, comprising the following steps:
    (a) placing a plurality of semiconductor elements in a processing chamber;
    (b) increasing a temperature in the processing chamber to a first predetermined temperature and importing at least one gas into the processing chamber, to increase pressure in the processing chamber to predetermined pressure and apply the processing chamber in a high-temperature and high-pressure working environment; and performing an isothermal-isobaric process on each semiconductor element at the first predetermined temperature and the predetermined pressure, to improve gas temperature uniformity in the processing chamber by the high pressure gas; and
    (c) decreasing the temperature in the processing chamber from the first predetermined temperature to a second predetermined temperature at least one predetermined rate and continuing to import the at least one gas into the processing chamber, to maintain the processing chamber at the predetermined pressure; and performing a cooling and isobaric process on each semiconductor element, to improve gas temperature uniformity and reduce stress and vibration of various layers of materials on each semiconductor element caused by a pressure difference, to suppress warpage of each semiconductor element.

2. The method for suppressing material warpage by increasing a gas density according to claim 1, wherein the at least one gas is air and/or nitrogen.

3. The method for suppressing material warpage by increasing a gas density according to claim 1, wherein the at least one gas in step (b) has a predetermined quantity of gas molecules, and the predetermined quantity of gas molecules cause the processing chamber to be maintained at the predetermined pressure, to control gas temperature uniformity in the processing chamber by the predetermined quantity of gas molecules.

4. The method for suppressing material warpage by increasing a gas density according to claim 1, wherein the first predetermined temperature in the processing chamber is set to fall within a range of 60° C. to 1500° C.

5. The method for suppressing material warpage by increasing a gas density according to claim 1, wherein the second predetermined temperature in the processing chamber is set to fall within a range of (25° C., 100° C.], and the second predetermined temperature is less than the first predetermined temperature.

6. The method for suppressing material warpage by increasing a gas density according to claim 1, wherein the predetermined pressure in the processing chamber is set to fall within a range of (1.3 atmospheric pressure (atm), 100 atmospheric pressure (atm)).

* * * * *